United States Patent
Chung et al.

(10) Patent No.: US 6,340,838 B1
(45) Date of Patent: Jan. 22, 2002

(54) APPARATUS AND METHOD FOR CONTAINING SEMICONDUCTOR CHIPS TO IDENTIFY KNOWN GOOD DIES

(75) Inventors: Tae Gyeong Chung; Nam Seog Kim, both of Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/241,655

(22) Filed: Feb. 2, 1999

(30) Foreign Application Priority Data

Apr. 8, 1998 (KR) ............................................. 98-12438

(51) Int. Cl.[7] ........................... G01R 31/02; H01R 4/58
(52) U.S. Cl. ......................... 257/668; 257/48; 257/678; 257/698; 257/730; 324/755; 324/765; 324/758; 324/754
(58) Field of Search ........................... 257/48, 678, 626, 257/609, 730, 666, 676, 686, 683, 682, 737, 738, 772–781, 784, 698; 424/938–941; 29/739–743; 206/701, 706, 707, 710–712; 324/760, 765, 755, 158.1, 758; 439/266–268, 271, 68, 69, 74; 438/14, 17, 18

(56) References Cited

U.S. PATENT DOCUMENTS 5,644,247 A * 7/1997 Hyan et al. ................. 324/755
5,742,169 A * 4/1998 Akram et al. ................ 324/755
5,796,590 A * 8/1998 Klein .......................... 361/774
5,831,441 A * 11/1998 Motooka et al. ............. 324/754
5,896,036 A * 4/1999 Wood et al. .................. 324/755
5,945,834 A * 8/1999 Nakata et al. ............... 324/754
5,997,378 A * 12/1999 Dynka et al. .................. 445/25
6,040,702 A * 3/2000 Hembree et al. ............ 324/755
6,064,216 A * 5/2000 Farnworth et al. .......... 324/755
6,094,058 A * 7/2000 Hembree et al. ............ 324/755

* cited by examiner

Primary Examiner—Alexander O. Williams
(74) Attorney, Agent, or Firm—Skjerven Morrill MacPherson LLP; David W. Heid

(57) ABSTRACT

An apparatus for identifying a known good die according to an embodiment of the present invention includes a carrier for containing a bare semiconductor chip, a lid for covering the carrier, and a stopper for sealing the apparatus. The carrier includes: a body, in which a chip mount cavity and multiple vacuum suction holes are formed; inner connection terminals formed on a bottom surface of the chip mount cavity to communicate electrically with the bare chip; and outer connection terminals extending from the inner connection terminals to outside the body. The apparatus has an outer configuration of a conventional semiconductor package, so that the apparatus can fit into conventional test equipment. Therefore, the carrier can have a configuration of a plastic package, such as the SOP or SOJ, without a semiconductor chip. Accordingly, the apparatus according to the present invention can use conventional handling and burn-in test equipment in identifying of known good dies and thereby reduce production cost of the known good dies.

13 Claims, 6 Drawing Sheets

APPARATUS AND METHOD FOR CONTAINING SEMICONDUCTOR CHIPS TO IDENTIFY KNOWN GOOD DIES

BACKGROUND OF THE INVENTION

1. Field of the Invention

The present invention relates to an apparatus or carrier and a method for testing semiconductor integrated circuits, and more particularly for identifying known good dies.

2. Description of the Related Arts

A demand for a semiconductor device package with a small foot-print has given a rise to a multi-chip module (MCM) technology which includes multiple semiconductor chips within a single package outline. In order for the MCM technology to be used widely, a technology for obtaining a Known Good Die (KGD), which refers to a bare semiconductor chip that passed a burn-in test which is typically performed on a packaged semiconductor chip, must be established. The burn-in test operates semiconductor chips in accelerated conditions to identify a semiconductor chip that is likely to fail early in its life.

Two types of burn-in test are available for bare chips; a wafer-level burn-in test and a die-level (or chip-level) burn-in test. The wafer-level burn-in test simultaneously tests all semiconductor chips on a wafer and uses a probe card that contacts fine-pitched terminal pads of the semiconductor chips of a wafer. However, a thermal expansion coefficient mismatch between the wafer and the probe card or a slight warpage of the probe card can cause contact failures between the probe card and the terminal pads. Accordingly, only relatively small wafers can use the wafer-level burn-in test. Further, in the wafer-level burn-in test, it is very difficult to maintain a burn-in temperature of about 125° C. because a different yield of the wafer produces a different amount of heat from the wafer during the burn-in test.

The die-level burn-in test does not encounter with the problems described above, but the test requires a carrier that contains a semiconductor chip during the test. Examples of such carriers are "Diepak" of Aehr Co. and "Diemate" of Texas Instrument Co. However, these carriers have specific designs that require special equipment for handling the carriers during burn-in testing. This increases the manufacturing costs of known good dies.

SUMMARY OF THE INVENTION

An apparatus for manufacturing a known good die according to an embodiment of the present invention includes a carrier for containing a bare semiconductor chip, a lid for covering the carrier, and a stopper for sealing the apparatus. The carrier includes: a body, in which a chip mount cavity and multiple vacuum suction holes are formed; inner connection terminals formed on a bottom surface of the chip mount cavity to communicate electrically with the bare chip; and outer connection terminals extending from the inner connection terminals to outside of the body. The bare chip is burned-in as contained in the apparatus. After the test, the apparatus releases the stopper and unloads the bare chip.

The apparatus according to the present invention has an outer configuration of a conventional semiconductor package, such as a Small Outline Package (SOP), a Small Outline J-Leaded Package (SOJ), or a Ball Grid Array Package (BGA), so that the apparatus can be used in conventional test equipment. Therefore, the carrier can have a configuration of a plastic package, such as the SOP or SOJ, without a semiconductor chip. A top surface of the carrier has an open cavity for receiving a semiconductor chip to be tested and leads which provide inner connection terminals. Outer leads of the carrier are used as the outer connection terminals. The carrier also can have a BGA configuration. In this case, the carrier is a printed circuit board having a chip mount area, inner connection terminals on a top surface of the board, and outer connection terminals on a bottom surface of the board. The outer connection terminals are solder balls attached on solder ball pads formed on the bottom surface. The solder ball pads connect to the inner connection terminals by internal wiring of the printed circuit board.

Accordingly, the apparatus according to the present invention can use conventional handling and burn-in test equipment in manufacturing known good dies.

BRIEF DESCRIPTION OF THE DRAWINGS

The various features and advantages of the present invention will be more readily understood with reference to the following detailed description taken in conjunction with the accompanying drawings, wherein like reference numerals designate like structural elements, and, in which.

DETAILED DESCRIPTION OF THE PREFERRED EMBODIMENTS

Figure 1:
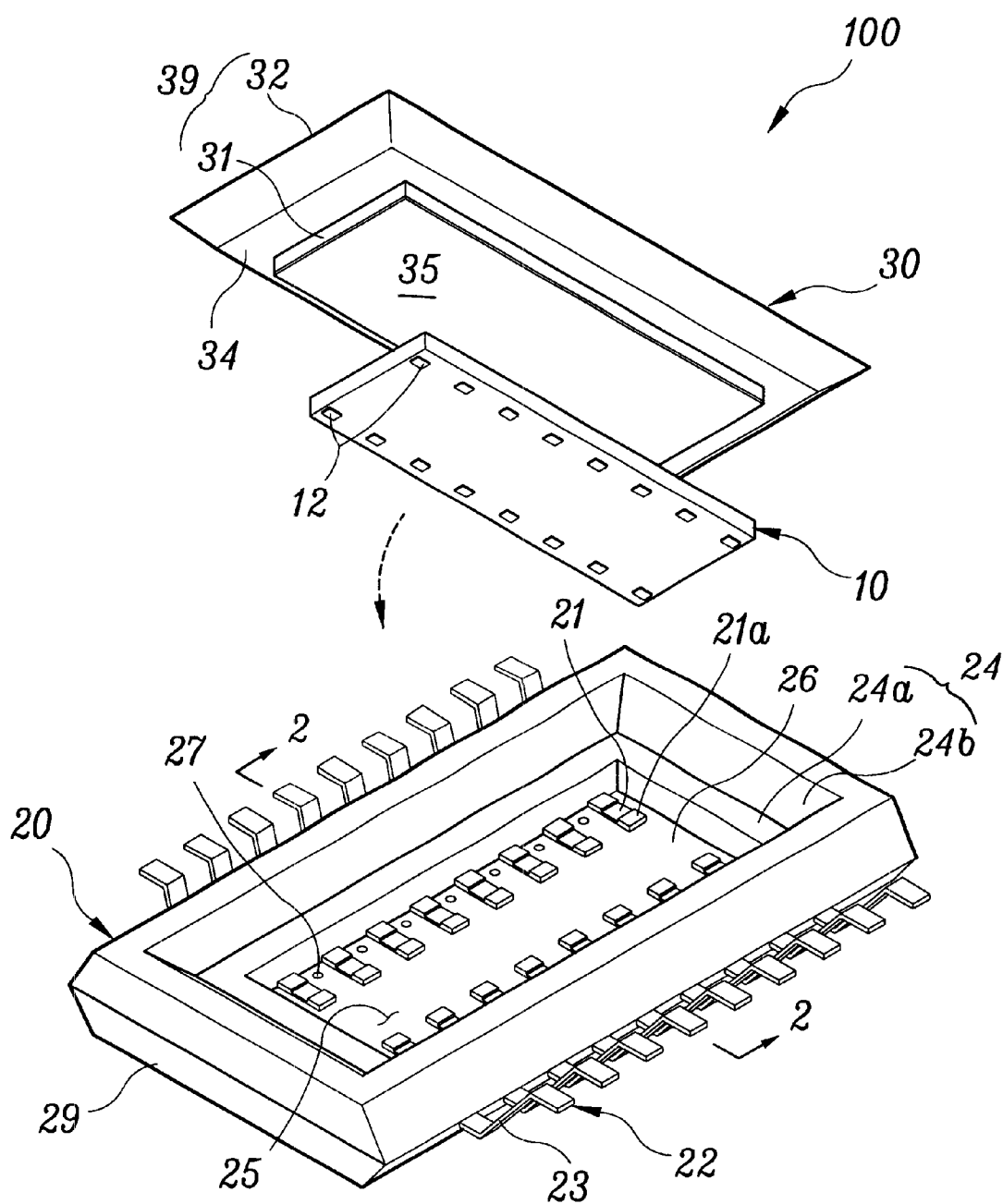
FIG. 1 is an perspective view of an apparatus for manufacturing a known good die according to an embodiment of the present invention.
Figure 2:
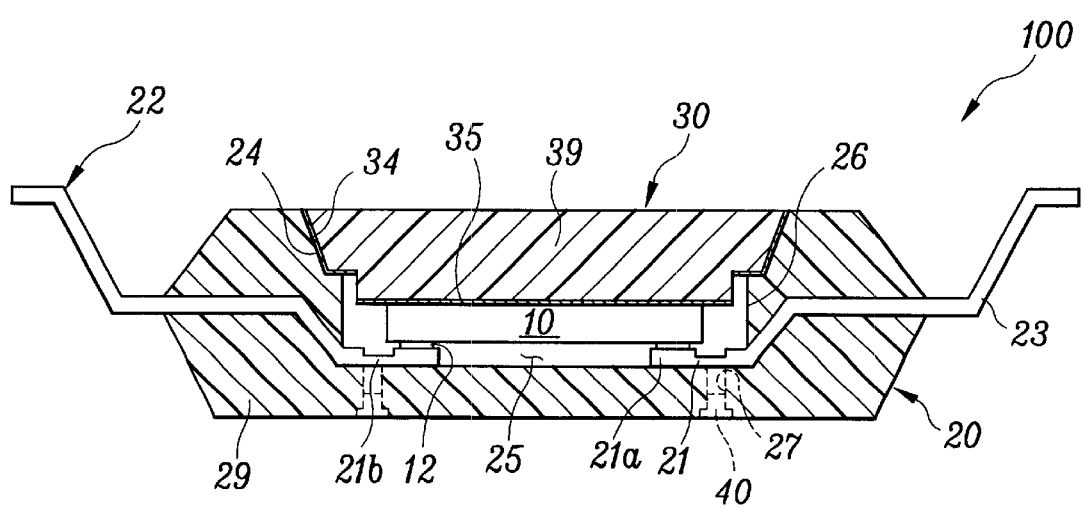
FIG. 2 is a cross-sectional view of the apparatus of FIG. 1 taken along the line 2—2.

With reference to FIGS. 1 and 2, an apparatus 100 for identifying a known good die according to an embodiment of the present invention includes a carrier 20 having a chip mount cavity 25 for receiving a bare chip 10, and a lid 30 for covering carrier 20 and holding bare chip 10 in chip mount cavity 25. Herein, apparatus 100 has an outer configuration of a conventional plastic package, a SOP (Small Outline Package).

Carrier 20 includes a body 29 having chip mount cavity 25 which is open to a top surface of body 29 so as to receive chip 10, and multiple leads 22 which contact respective terminal pads 12 of chip 10 in chip mount cavity 25. Each of leads 22 can be divided into two parts. A part of lead 22 that is within body 29 and exposed on a bottom surface 26 of chip mount cavity 25 is an inner lead 21, and a part of lead 22 that extents from inner lead 21 and protrudes from body 29 is an outer lead 23. Inner leads 21 contact corresponding terminal pads 12 of chip 10, and a part 21b of an inner lead 21 next to an inner lead tip 21a can be half-etched so as to improve a contact between inner lead 21 and pad 12.

Body 29 further includes multiple vacuum suction holes 27 which are through-holes formed on bottom surface 26 of chip mount cavity 25. In sealing carrier 20 with lid 30, a vacuum is applied to cavity 25 through vacuum suction holes 27.

A conventional transfer molding used for a plastic package can manufacture carrier 20 by employing an upper mold die shaped so as to form chip mount cavity 25 and to expose inner leads 21 on bottom surface 26 of chip mount cavity 25, and using a lead frame including leads 22. The lead frame which is made of Alloy 42 or a copper (Cu) alloy, can be manufactured by a stamping or etching method. For forming part 21b for the improved contact, an etching method is preferred.

Chip mount cavity 25 of body 29 has a step 24 around the inside of cavity 25 so that lid 30 can sit on step 24. Lid 30 includes a lid body 39 and buffers 34 and 35 made of a material such as rubber that attaches to surfaces of lid body 39. The surfaces of buffers 34 and 35 are in contact with body 29 and chip 10 in sealing cavity 29. Lid body 39 includes a first lid body 32 which sits on step 24, and a second lid body 31 which protrudes from first lid body 32 so that a bottom surface of second lid body 31 contacts a back surface of a chip 10 placed in chip mount cavity 25. Buffer 35 attaches to the bottom surface of second lid body 31 to reduce the impact on bare chip 10 when lid 30 contacts bare chip 10, and buffer 34 attaches to surfaces that contact step surfaces 24b and 24a of step 24.

The thickness of first lid body 32 is approximately the same as the depth of step surface 24a from the top of carrier 20, and the thickness of second lid body 31 is approximately the same as the depth of bottom surface 26 from step surface 24a minus a total thickness of inner lead 21 and chip 10. Therefore, when lid 30 covers chip mount cavity 25, buffer 34 of first lid body 32 contacts step surface 24a of step portion 24, and buffer 35 of second lid body 31 contacts chip 10. Lid 30 can be made of a plastic, a ceramic, or a metal. Step surface 24b of step 24 is inclined so that buffer 34 of first lid body 32 contacts step surface 24b for sealing carrier 20.

Figure 3A:
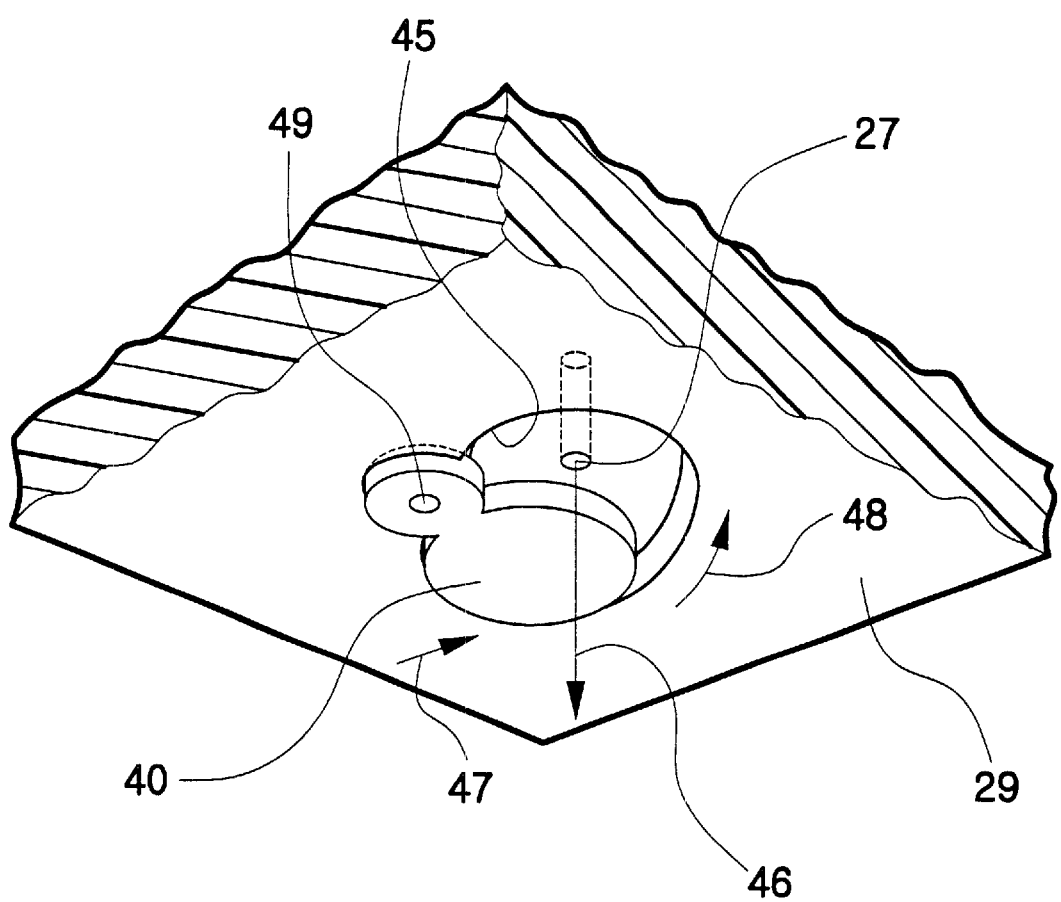
FIG. 3A is a perspective view of a stopper for the apparatus of FIG. 1.
Figure 3B:
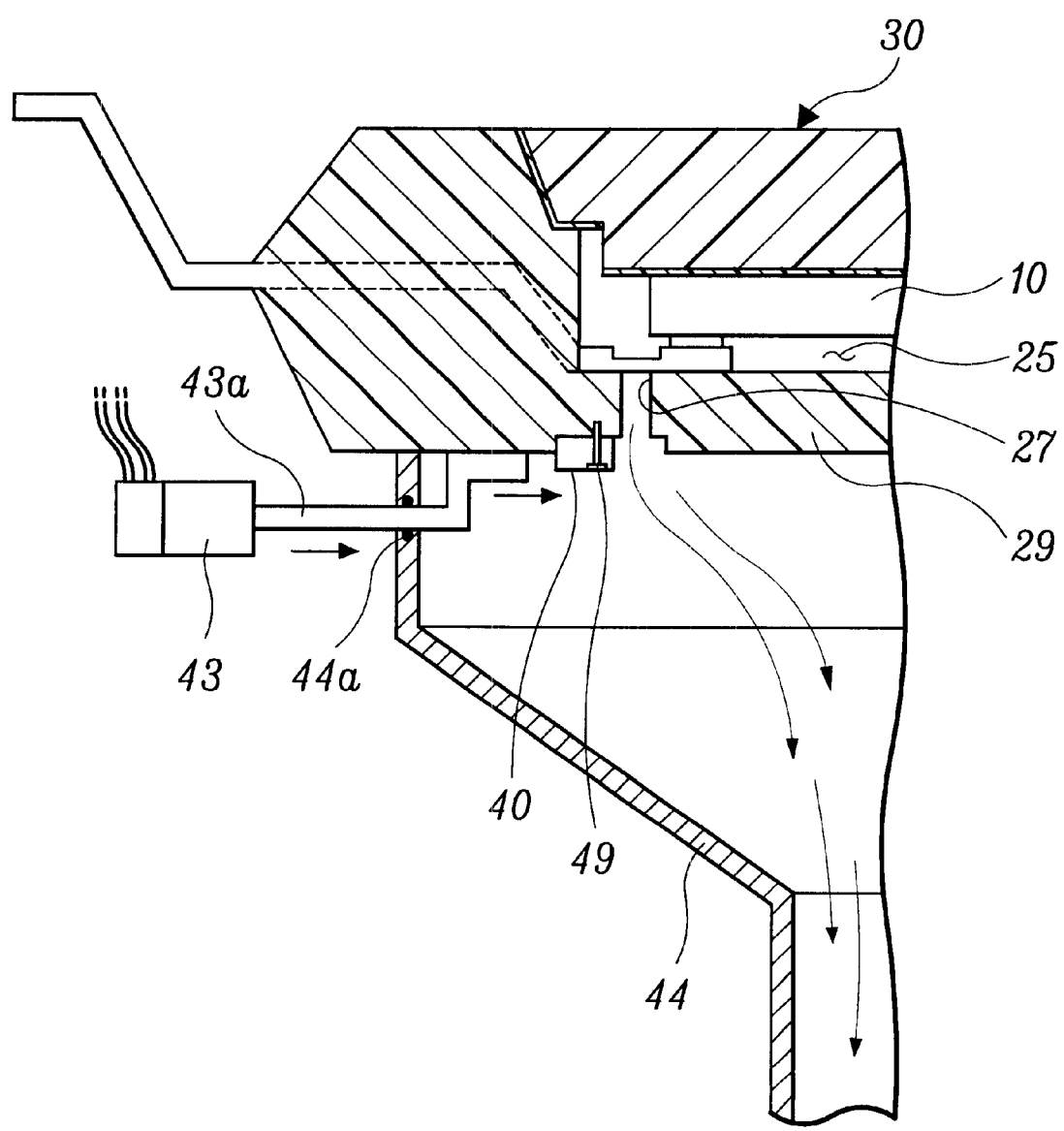
FIG. 3B is a cross-sectional view of the apparatus of FIG. 1 for describing a sealing of the apparatus.

Referring to FIGS. 3A and 3B, stoppers 40 close vacuum suction holes 27 so that a vacuum in cavity 25 holds lid 30 and body 29 together. Lid 30 contacts the back surface of bare chip 10 and step 24 by vacuum introduced in cavity 25 through vacuum suction holes 27. Then, stoppers 40 close vacuum suction holes 27 to maintain the vacuum and keep lid 30 held to carrier 20. When stoppers 40 are removed from vacuum suction holes 27, lid 30 is released from carrier 20.

FIG. 3A shows an example of vacuum suction hole 27 and stopper 40. Directions 47 and 48 are respectively a direction of an external force for moving stopper 40 to close vacuum suction hole 27 and a direction in which stopper 40 rotates about a pin 49. Stopper 40 moves within a recess 45 which is formed on a back side of body 29, and vacuum suction hole 27 is within a boundary of recess 45. When rotating back and forth about pin 49, stopper 40 opens and closes vacuum suction hole 27. Recess 45 should be wide enough to make stopper 40 move so as to open and close vacuum suction hole 27. In addition, stopper 40 can protrude above the back side of body 29, so that an external force can be easily applied to stopper 40 by means such as a cylinder rod 43a of FIG. 3B.

With reference to FIGS. 3A and 3B, a process for mounting bare chip 10 on apparatus 100 according to a embodiment of the present invention is described hereinafter. Bare chip 10 is placed upside down in chip mount cavity 25, so that terminal pads 12 of chip 10 contact respective inner lead tips 21a which are exposed on bottom surface 26 of chip mount cavity 25. After the chip placement, lid 30 covers chip 10 and chip mount cavity 25, so that buffer 34 contacts step surfaces 24a and 24b, and buffer 35 contacts the back surface of chip 10. Then, a vacuum suction pump or other suction means 44 is attached to the back side of body 29, and vacuum suction means 44 applies vacuum to vacuum suction hole 27, so that external pressure holds lid 30 step surfaces 24a and 24b and slightly presses chip 10. While the vacuum still being applied, cylinder rod 43a which is driven by a cylinder 43 pushes a side surface of stopper 40 so as to close vacuum suction hole 27. After closing vacuum suction hole 27, vacuum suction means 44 stops applying the vacuum force and is detached from body 29.

Cylinder 43 is outside vacuum suction means 44, and cylinder rod 43a penetrates vacuum suction means 44. Thus, in order to avoid a vacuum leakage through the penetration part, an O ring 44a is installed at the penetration part.

As being contained in apparatus 100, chip 10 undergoes various test procedures that use conventional test equipment for an SOP device which has the same configuration as apparatus 100. After the test procedures are completed, stoppers 40 are moved so as to open vacuum suction holes 27. Then, lid 30 is separated from carrier 20, and chip 10 is removed from chip mount cavity 25 and classified according to the test results.

As an example of a variation, when a chip has terminal pads along four sides on the top surface of the chip, apparatus 100 can have a configuration of a Quad Flat Package (QFP), and inner leads of apparatus 100 are formed on four sides of the bottom of the chip mount cavity.

In addition, a conductive film such as ASMAT® (Application Specific Material) of Nitto Denko can be inserted between the chip and the inner lead to achieve secure electrical contacts between the inner lead tips and the terminal pads. In this case, it is preferable that conductive bumps are formed on the terminal pads.

Figure 4:
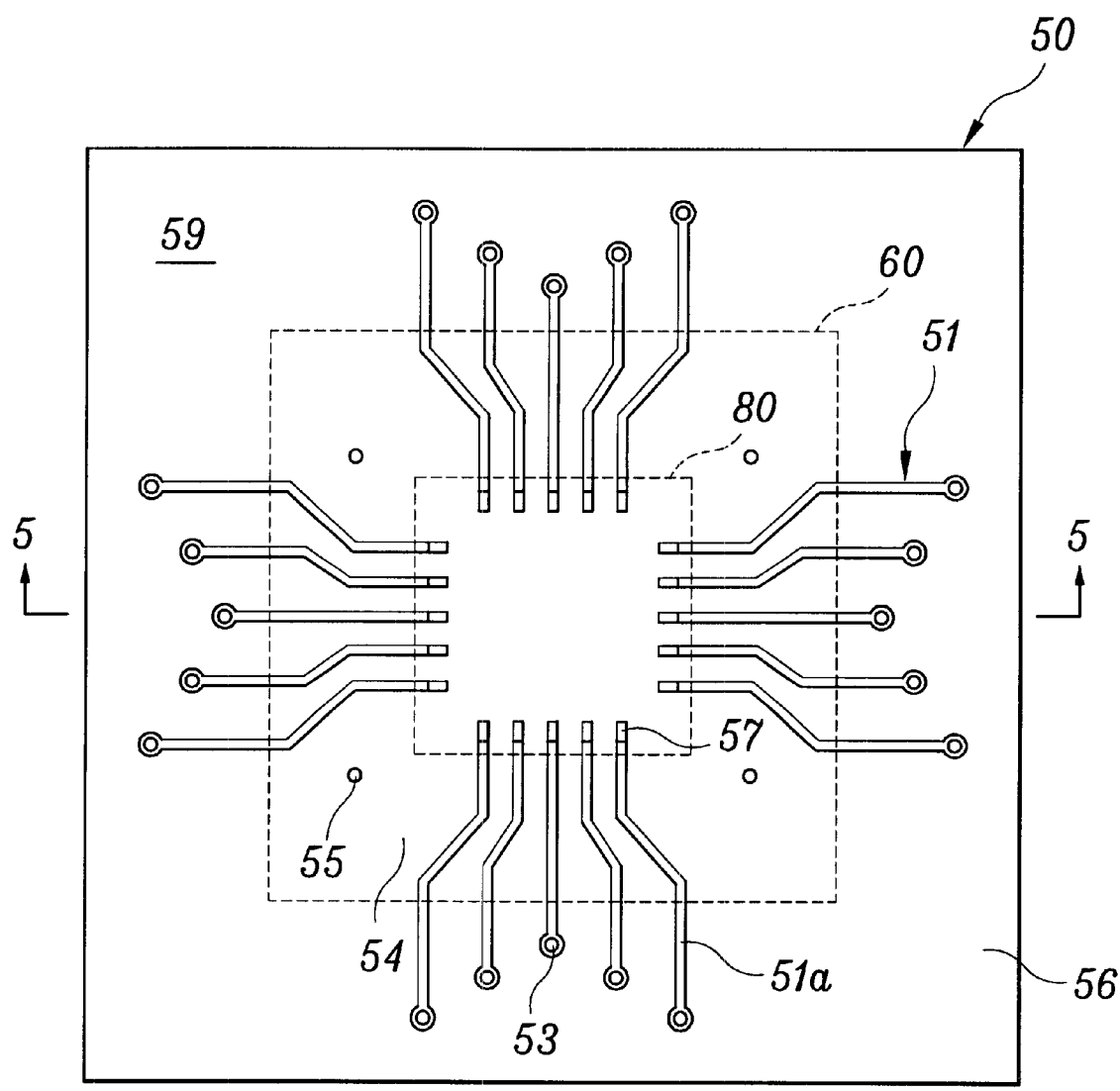
FIG. 4 is a plan view of a carrier of an apparatus for manufacturing a known good die according to another embodiment of the present invention.
Figure 5:
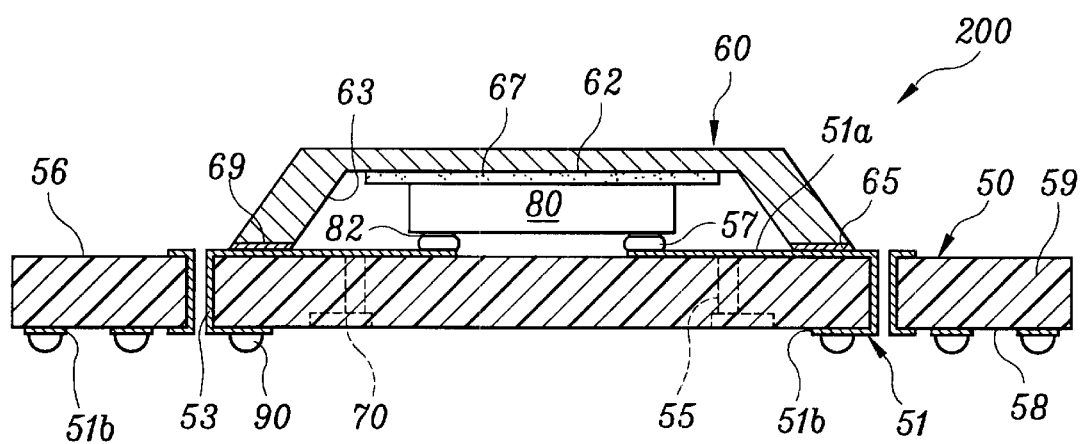
FIG. 5 is a cross-sectional view of the apparatus of FIG. 3 taken along the line 4—4.

With reference with FIGS. 4 and 5, an apparatus 200, which has a configuration of a conventional BGA package, for identifying a known good die according to another embodiment of the present invention is explained. Apparatus 200 includes a printed circuit board 50 with a chip mount area 54 on which a bare chip 80 is mounted, a lid 60 which covers chip mount area 54 and holds bare chip 80 mounted on chip mount area 54 by slightly pressing on a back side of chip 80, and outer connection terminals such as solder balls 90, which are attached to a lower surface 58 of printed circuit board 50.

Printed circuit board 50 includes a body 59 having an upper surface 56 and a lower surface 58, wiring patterns 51 which are formed by patterning thin copper layers deposited on upper and lower surfaces 56 and 58, and via holes 53 which are formed through body 59 and electrically connect upper wiring patterns 51a of upper surface 56 to respective lower wiring patterns 51b of lower surface 58. Herein, inner walls of via holes 53 are plated with a conductive material such as copper (Cu) or gold (Au). Printed circuit board 50 further includes multiple vacuum suction holes 55 formed through body 59 for holding lid 60. It is preferable to form vacuum suction holes 55 within a boundary of lid 60 and via holes 53 outside the boundary of lid 60.

Upper wiring patterns 51a extend to chip mount area 54, and tips of upper wiring patterns 51a contact terminal pads 82 of chip 80. Each tip of upper wiring patterns 51a can have a metal bump 57 formed thereon to facilitate the contact between terminal pads 82 of chip 80 and tips of upper wiring patterns 51a. It is preferable that metal bump 57 is made of gold (Au) and 20 μm high. Upper and lower surfaces 56 and 58 of printed circuit board 50, excluding parts of upper wiring patterns 51a on which metal bumps 57 are formed, and parts of lower wiring patterns 51*b* to which solder balls 90 attach, can be covered with a Photo Solder Resist (PSR) film (not shown).

A conventional printed circuit board manufacturing technique can produce printed circuit board 50. Although wiring patterns 51 of the embodiment are formed only on upper and lower surfaces 56 and 58 of printed circuit board 50, printed circuit board 50 can include wiring patterns on an inner surface of the printed circuit board as well as on the upper and the lower surfaces.

Lid 60 can be made of a plastic, a ceramic, or a metal. Lid 60 has an open cavity 63 so as to cover a chip 80 placed on chip cavity area 54 of printed circuit board 50. A buffer such as an elastomer 67 attaches to an inner surface 62 of cavity 63 and reduces the impact on chip 80 when lid 60 presses on chip 80, and another buffer 65 made of a material such as a rubber attaches to a bottom surface 69 of lid 60. The depth of cavity 63 of lid 60 depends on the thickness of chip 80 mounted on printed circuit board 50. Stoppers 70 close and open vacuum suction holes 55 in a way similar to the way stoppers 40 of FIGS. 2, 3A and 3B close and open vacuum suction holes 27.

To mount chip 80, chip 80 is placed upside down on chip mount area 54 so that terminal pads 82 of chip 80 contact metal bumps 57 of respective upper wiring patterns 51*a*. Then, lid 60 covers chip mount area 54 on which chip 80 is mounted, and vacuum applied through vacuum suction holes 55 in a similar way as the embodiment of FIG. 3B holds lid 60 to upper surface 56 of printed circuit board 50. Herein., the back surface of chip 80 contacts elastomer 67, and rubber 65 contacts upper surface 56 of printed circuit board 50. While the vacuum is still being applied, stoppers 70 close vacuum suction holes 55 in a way similar to that described with reference to FIGS. 3A and 3B.

While contained in apparatus 200, chip 80 undergoes various test procedures that use conventional test equipment for a BGA package that has the same configuration as apparatus 200. After the test procedures are completed, stoppers 70 are moved to open vacuum suction holes 57. Then, lid 60 is separated from printed circuit board 50, and chip 80 is removed from chip mount area 54 and classified according to the test results.

As a variation of the embodiment described in FIGS. 4 and 5, metal bumps can be formed on terminal pads of the bare chip, not on the upper wiring patterns.

Since the apparatuses 100 and 200 have a similar configuration to that of a conventional package, the apparatuses in accordance with the present invention can use conventional test equipment designed for the types of packages that the apparatuses imitated. Accordingly, production costs for known good dies are reduced.

Although particular embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. An apparatus for containing a semiconductor device chip therein comprising:
   (A) a carrier comprising:
      (a) a body having a cavity which is open to a top surface of the body, the body also having a vacuum suction hole which is formed through a bottom surface of the cavity;
      (b) conductive inner connection terminals on the bottom surface of the cavity; and
      (c) conductive outer connection terminals which extend from the inner connection terminals and protrude outside of the body;
   (B) a lid for covering the cavity; and
   (C) a stopper attached to the carrier such that the stopper closes or opens the vacuum suction hole,
   wherein the apparatus has an outer configuration of a semiconductor device package so that the apparatus fits into test equipment for the semiconductor device package.

2. The apparatus as claimed in claim 1, wherein a periphery of the cavity is stepped so that the lid can sit on the stepped periphery.

3. The apparatus as claimed in claim 1, wherein the inner connection terminals comprise connection parts which protrude so as to enhance contacts between the connection parts and terminal pads of a semiconductor device chip placed in the cavity.

4. The apparatus as claimed in claim 1, wherein a buffer is attached to a surface, of the lid.

5. The apparatus as claimed in claim 1, further comprising a conductive film in the cavity contacting the inner connection terminals.

6. A method for mounting a semiconductor device chip in the apparatus of claim 1 comprising:
   placing the semiconductor device chip in the cavity so that terminal pads of the semiconductor device chip contact the respective inner connection terminals;
   placing the lid over the cavity;
   applying a vacuum the vacuum suction hole;
   closing the vacuum suction hole with the stopper while the vacuum is still applied, so that the lid is held to the body; and
   removing the vacuum.

7. An apparatus comprising:
   (A) a printed circuit board comprising:
      (a) a body having a chip mount area on an upper surface of the body;
      (b) upper wiring patterns formed on the upper surface in the chip mount area;
      (c) lower wiring patterns formed on a lower surface of the body;
      (d) via holes formed through the body of the printed circuit board to electrically connect the upper wiring patterns to the lower wiring patterns; and
      (e) a vacuum suction hole formed through the body of the printed circuit board;
   (B) outer connection terminals attached to the lower wiring patterns;
   (C) a lid for covering the chip mount area; and
   (D) a stopper attached to the printed circuit board such that the stopper closes and opens the vacuum suction hole,
   wherein the apparatus has an outer configuration of a semiconductor device package so that the apparatus fits into test equipment for the semiconductor device package.

8. The apparatus as claimed in claim 7, wherein an elastomer is attached to an inner wall of the lid.

9. The apparatus as claimed in claim 7, wherein a buffer is attached to a portion of the lid, the portion contacting the upper surface of the printed circuit board.

10. The apparatus as claimed in claim 9, wherein the buffer is rubber.

11. The apparatus as claimed in claim 7, wherein the outer connection terminals are solder balls.

12. The apparatus as claimed in claim 7, wherein bumps are formed on the upper wiring patterns.

13. A method for mounting a semiconductor device chip in the apparatus of claim 7 comprising:

placing the semiconductor device chip in the chip mount area so that terminal pads of the semiconductor device chip contact the respective upper wiring patterns;

placing the lid over the chip mount area;

applying a vacuum through the vacuum suction hole;

closing the vacuum suction hole with the stopper while the vacuum is still applied, so that the lid is held to the body; and removing the vacuum.

* * * * *